United States Patent
Yamamoto et al.

[11] Patent Number: 5,124,736
[45] Date of Patent: Jun. 23, 1992

[54] PROCESS AND APPARATUS FOR DEVELOPING PHOTOPOLYMER PLATES

[75] Inventors: Katsumasa Yamamoto; Kyoichi Mizuno; Kosaku Onodera; Keizo Kawahara; Masaru Nanpei, all of Ootsu, Japan

[73] Assignee: Toyo Boseki Kabushiki Kaisha, Osaka, Japan

[21] Appl. No.: 619,969

[22] Filed: Nov. 30, 1990

[30] Foreign Application Priority Data

Nov. 30, 1989 [JP] Japan ................................ 1-312809
Apr. 19, 1990 [JP] Japan ................................ 2-103717

[51] Int. Cl.$^5$ .............................................. G03D 3/06
[52] U.S. Cl. .................................... 354/325; 354/317; 354/320; 210/251; 15/77
[58] Field of Search ............. 354/317, 319, 320, 322, 354/324, 325; 15/77, 100, 102; 210/196, 251

[56] References Cited

U.S. PATENT DOCUMENTS

| | | | |
|---|---|---|---|
| 3,589,261 | 6/1971 | Krikelis | 354/322 |
| 4,081,577 | 3/1978 | Horner | 354/325 |
| 4,239,368 | 12/1980 | Krause et al. | 354/325 |
| 4,359,279 | 11/1982 | Popoff | 354/325 X |
| 4,428,659 | 1/1984 | Howard | 354/317 |
| 4,752,283 | 6/1988 | Copeland et al. | 354/324 X |

OTHER PUBLICATIONS

Patent Abstracts of Japan, vol. 8, No. 183 (P-296) [1620] Aug. 23, 1984 & JP-A-59 074 559 (Yoshima Shiyoukai K.K.) Apr. 27, 1984.

*Primary Examiner*—A. A. Mathews
*Attorney, Agent, or Firm*—Wegner, Cantor, Mueller & Player

[57] ABSTRACT

Disclosed herein are a process and apparatus for developing photopolymer plates which are useful for flexographic printing on account of their rubber-like elasticity, capability for development by water washing, and good ink resistance. The process and apparatus are designed to circulate by force the washout solution during the development operation in order to minimize the aggregation of photopolymer particles suspending in the washout solution and to completely catch scum which occurs when the unexposed part of the polymer plate is rubbed off in the washout solution.

6 Claims, 4 Drawing Sheets

PROCESS AND APPARATUS FOR DEVELOPING PHOTOPOLYMER PLATES

BACKGROUND OF THE INVENTION

1. Field of the Invention

The present invention relates to a process and apparatus for developing photopolymer plates. More particular, the present invention relates to a process and apparatus for developing photopolymer plates which are useful for flexographic printing on account of their rubber-like elasticity, capability for development by water washing, and good ink resistance. The process and apparatus of the present invention are so designed as to minimize the aggregation of photopolymer particles suspending in the washout solution and to completely catch scum (polymer dispersion and aggregates thereof) which has separated out from the washout solution in the step of washing out the photopolymer plate.

2. Description of the Prior Art

The photopolymer plates are rapidly coming into general use in various fields of printing because of their better handleability, higher productivity, lower price, and improved printing performance as compared with the conventional printing plates.

There are several types of apparatus in practical use for the development of photopolymer plates. (1) One which forms the relief by blowing off the unexposed part by means of compressed air. (2) One which forms the relief by spraying the washout solution under pressure to the plate. (3) One which forms the relief by rubbing a brush against the plate fixed to a flat surface or cylinder, thereby dissolving the unexposed part in the solution.

The above-mentioned third apparatus suffers from a disadvantage when the washout solution is water (tap water) or surfactant-containing water. The surfactant disperses polymer particles which have been washed out and prevents them from aggregation; however, it does not prevent scum from separating out in the washout solution when the photopolymer is washed out in large quantities and is dispersed in high concentrations in the washout solution. When left unremoved, scum sticks to the developing machine and brush and even to the developed printing plate, causing a serious problem.

As the result of their researches to eliminate the above-mentioned disadvantages, the present inventors developed an improved process and apparatus for the development of photopolymer plates as mentioned in the following.

SUMMARY OF THE INVENTION

It is an object of the present invention to provide an improved process for developing photopolymer plates by rubbing off the unexposed part of the photopolymer plate in a washout solution after exposure, wherein the improvement comprises circulating by force the washout solution, thereby preventing the polymer of the unexposed part which has been rubbed off from aggregating and precipitating.

It is another object of the present invention to provide an improved apparatus for developing photopolymer plates of the type having a bath for the washout solution, wherein the improvement comprises a circulating and filtering unit connected to said bath.

It is further another object of the present invention to provide a process and apparatus for reusing the washout solution after filtration to remove solids suspending in the washout solution used for the washout of photopolymer plates. This process and apparatus are based on the property that the photopolymer does not dissolve in the washout solution.

Owing to the circulating and filtering unit, the development process of the present invention may be run continuously and automatically for all the steps including washing out, rinsing, water draining, drying, and post exposure.

DETAILED DESCRIPTION OF THE INVENTION

Figure 1:
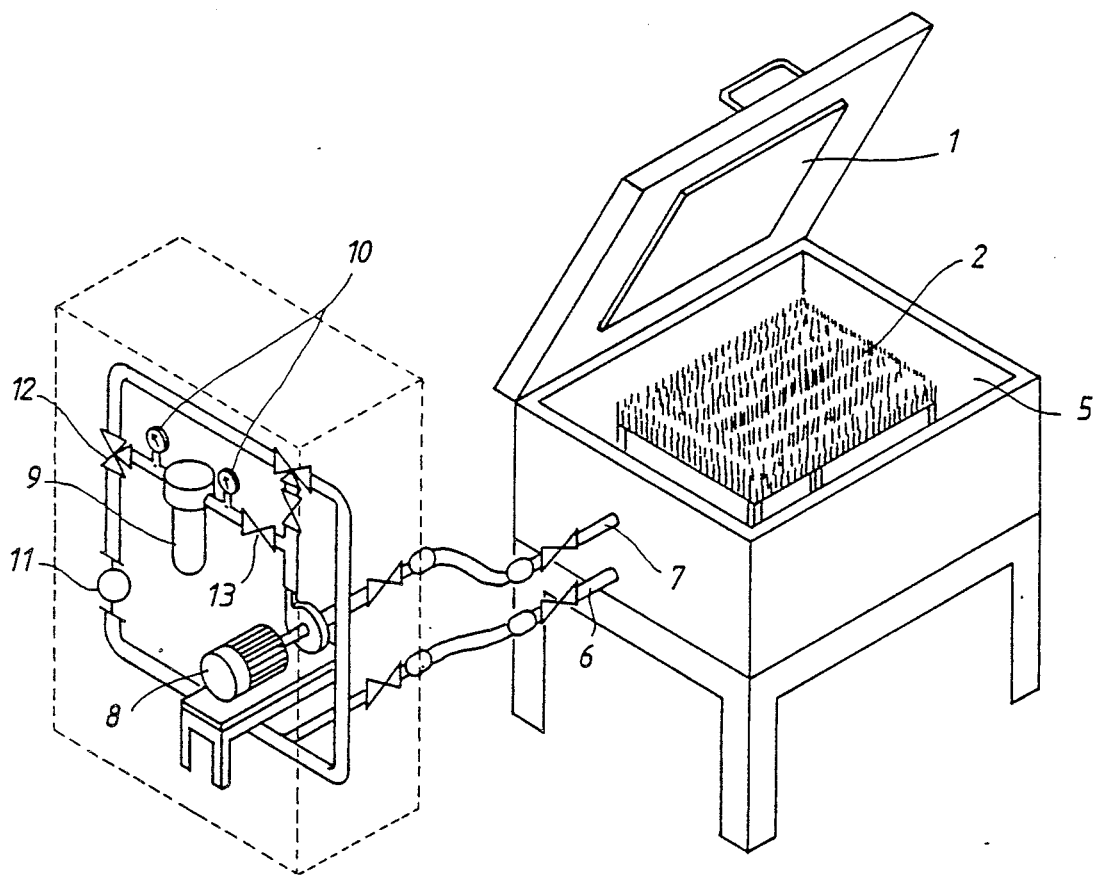
FIG. 1 is a schematic perspective view showing a flat type washout apparatus pertaining to the present invention.

According to the development process of the present invention, an exposed photopolymer plate is developed by rubbing off the unexposed part in a washout solution, while circulating the washout solution by force during development and simultaneously filtering out solids from the washout solution and recycling the filtrate. The forced circulation, filtration, and recycling are accomplished by the development apparatus of the present invention which comprises a circulating unit and filtering unit. The circulating unit is designed to circulate by force the washout solution in the washout bath. The filtering unit is designed to remove solids from the washout solution and to recycle the washout solution to the washout bath. The development process and development apparatus may be used for washout in a continuous, automatic developing machine.

The development process and apparatus of the present invention may be used for photopolymer plates made of a polyamide-based photopolymer (containing a polyamide as an essential component which dissolves or swells in a washout solution (water, alkaline aqueous solution, or alcohol)), a polyvinyl alcohol-based photopolymer (containing polyvinyl alcohol as an essential component), a polyester-based photopolymer (containing a low-molecular weight unsaturated polyester as an essential component), an acrylic-based photopolymer (containing a low-molecular weight acrylic polymer as an essential component), or a polyurethane-based photopolymer (containing polyurethane as an essential component). The photopolymer is incorporated with a photopolymerizable unsaturated monomer and photosensitizer and other additives to make it photopolymerizable.

There has recently been proposed a new photopolymer for flexographic plates which can be developed with a nontoxic aqueous washout solution for safety. The photopolymer includes one which is a copolymer of conjugated diene hydrocarbon and $\alpha,\beta$-ethylenic unsaturated carboxylic acid (or salt thereof), incorporated with a monoolefinic unsaturated compound; one which is a polymer of conjugated diene hydrocarbon polymer or a copolymer of conjugated diene hydrocarbon polymer and monoolefinic unsaturated compound, incorporated with a hydrophilic polymeric compound and a non-gaseous ethylenic unsaturated compound; and one which is a hydrophobic oligomer containing $\alpha,\beta$-ethylenic unsaturated groups, incorporated with a water-swellable elastomeric substance. The photopolymer is incorporated with a photopolymerizable unsaturated monomer and photosensitizer and other additives to make it photopolymerizable.

The development process and apparatus of the present invention may be used for a variety of photopolymers mentioned above. A preferred photopolymer is one which is composed of a hydrophobic polymer and a hydrophilic polymer and is liable to aggregate in a standing washout solution on account of its high adhesiveness. The hydrophobic polymer is one which contains 10–50 wt% of chlorine and has a glass transition temperature (Tg) lower than 5° C., like chlorinated polyethylene. The hydrophilic polymer is one which has an amide linkage and urethane linkage, a butadiene chain, a carboxylic acid or a salt thereof, with one terminal blocked with an ethylenically unsaturated bond.

The photopolymer plates used in the present invention are cured with ultraviolet rays having a wavelength of 150–500 nm, especially 300–400 nm, which are generated by a low-pressure mercury lamp, high-pressure mercury lamp, carbon arc lamp, ultraviolet fluorescent lamp, chemical lamp, xenon lamp, or zirconium lamp.

According to the process of the present invention, the photopolymer plate is exposed under the above-mentioned light source with ultraviolet rays through a negative film having a transparent image, and the exposed photopolymer plate is developed with a washout solution which removes the unexposed non-image part. This process forms a relief image on the photopolymer plate. The unexposed part which has been removed by the washout solution remains in the form of emulsion or suspension in the washout solution in the washout bath.

The washout solution is most desirably water (tap water) having a pH 5.0–9.0 which may optionally contain an alkaline compound (such as sodium hydroxide and sodium carbonate), surfactant, and water-soluble organic solvent. The addition of a surfactant is desirable for the photopolymer to readily disperse into water and to remain dispersed in water. Preferred surfactants are sodium alkyl-naphthalenesulfonate and sodium alkyl-benzenesulfonate. Other examples of the surfactant include anionic surfactants containing a carboxylate, sulfate-ester, sulfonate, or phosphate-ester; nonionic surfactants such as polyethylene glycol derivative, polyhydric alcohol derivative, and sorbitan derivative; cationic surfactants containing a primary, secondary, or tertiary amine salt, or a quaternary ammonium salt; and amphoteric surfactants containing an amino acid hydrophilic group or a betaine hydrophilic group. Incidentally, the washout solution should be used at 25°–50° C., preferably 35°–45° C.

According to the development process of the present invention, the washout solution is circulated by force so as to minimize the aggregation of the photopolymer which has been dispersed into the washout solution. The flow rate of circulation should be higher than 10 cm/s, preferably higher than 50 cm/s, and more preferably higher than 100 cm/s. The upper limit would be about 300 cm/s which depends on the capacity of the pump used. The forced circulation may be accomplished by any one of the following means.

- Stirring and circulating the washout solution by means of an external circulating pump through the inlet and outlet attached to the washout bath.
- Enhancing the above-mentioned stirring by means of a fan installed on the upper edge of the washout bath.
- Stirring the washout solution by means of a stirrer attached to the washout brush plate submerged in the washout solution, said stirrer working continuously while the washout brush plate is moving.
- Jetting the washout solution through the washout brush plate submerged in the washout solution by means of an external circulating pump.

Figure 2:
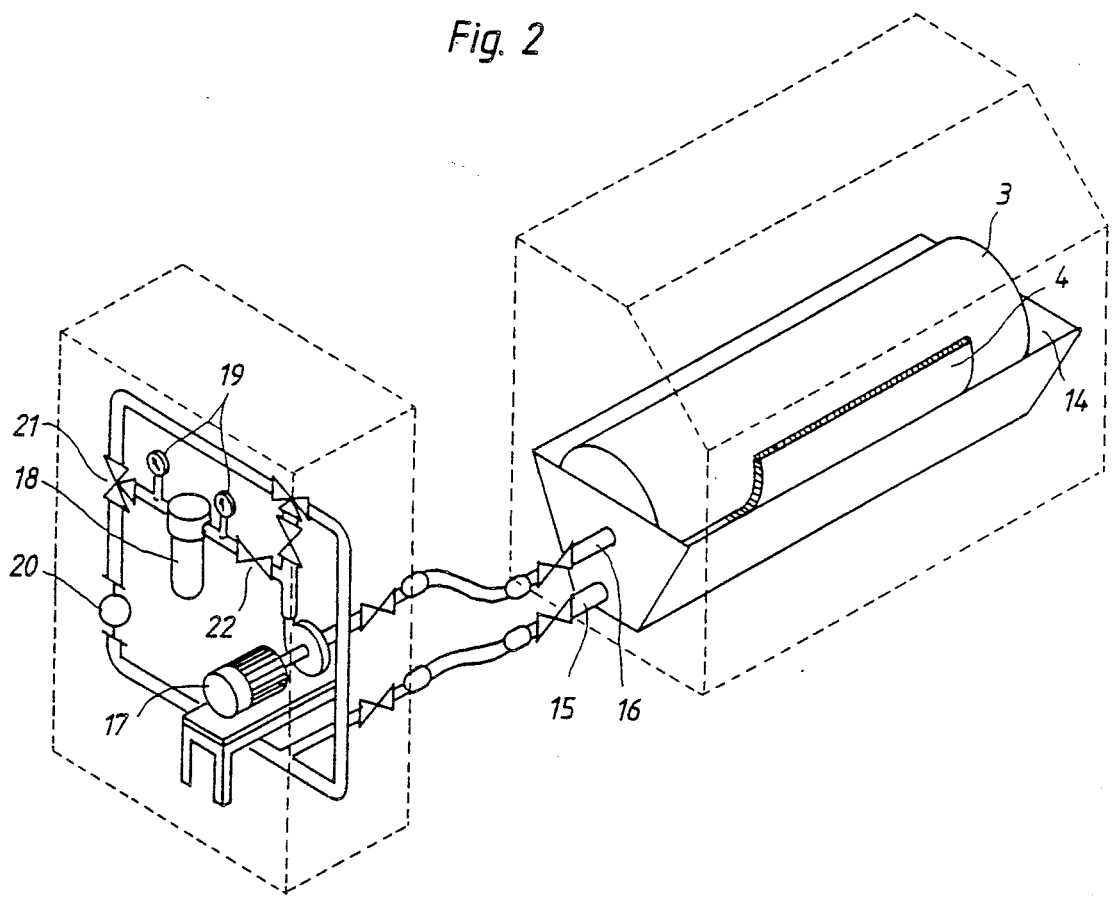
FIG. 2 is a schematic perspective view showing a rotary type washout apparatus pertaining to the present invention.
Figure 3:
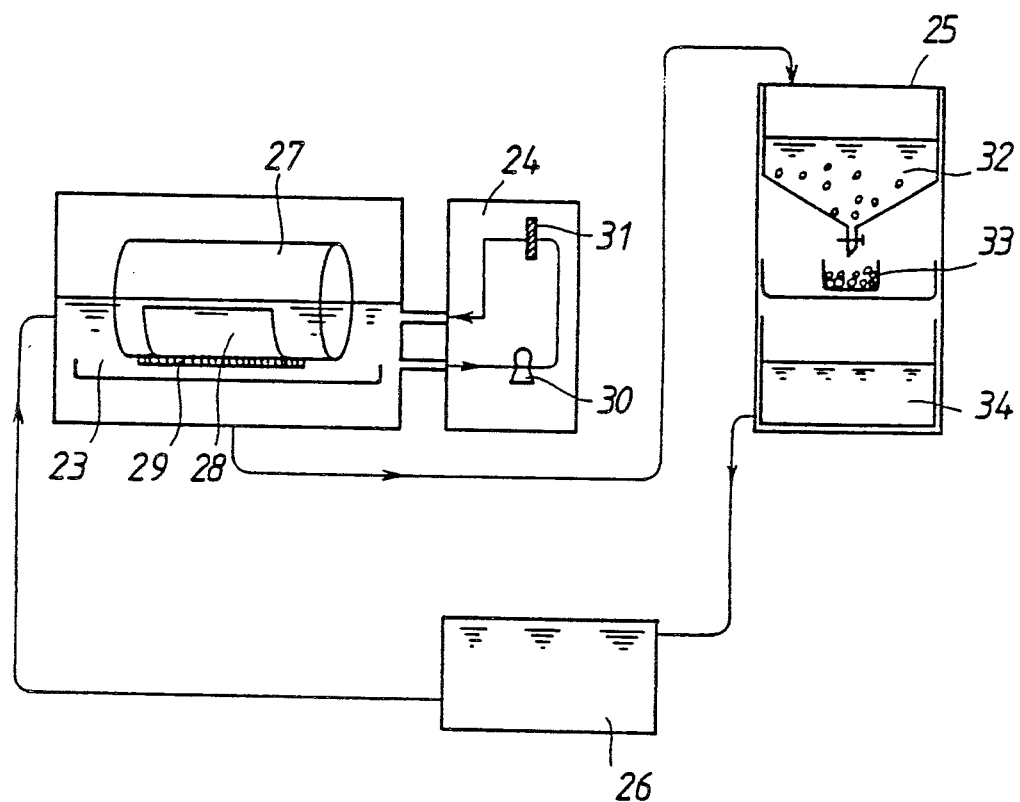
FIG. 3 is a schematic sectional view showing a washout apparatus composed of a washout bath, a circulating unit, and a filtering unit pertaining to the present invention.
Figure 4:
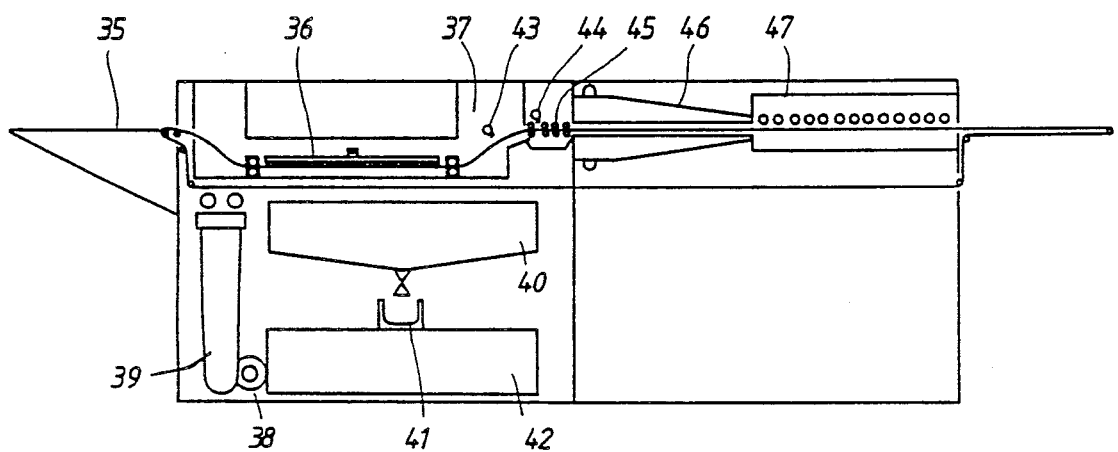
FIG. 4 is a schematic sectional view showing a continuous, automatic washout apparatus pertaining to the present invention.

The invention will be further and more concretely explained below by referring partly to the accompanying drawings wherein FIG. 1 is a schematic perspective view of a flat type washout apparatus, FIG. 2 is a schematic perspective view of a rotary type washout apparatus, FIG. 3 is a schematic cross-sectional view of workout tank, circulation device, and polymer filtration tank, and FIG. 4 is a schematic cross-sectional view of a continuous and automatic washout apparatus, all embodying the present invention.

Referring to FIG. 1 which shows a flat type washout apparatus embodying the present invention, a table 1 for fixing a photosensitive resin plate is flat and a brush table 2 is provided so as to be able to contact with said table 1.

FIG. 2 shows a rotary type developing apparatus which is provided with a plate fixing base 3 of rotary type and a brush stand 4 arranged close to said plate fixing base. The apparatuses shown in FIGS. 1 and 2 have in common a washout bath 5 (or 14), an inlet 6 (or 15), and an outlet 7 (or 16). The inlet is positioned at the lowest central part of the side of the washout bath. The outlet is positioned above the inlet and about 3 cm below the level of the washout solution. The outlet is connected through a pipe to a circulating pump 8 (or 17) which distributes the washout solution into the main route and the bypass route.

The bypass route is provided with a cartridge filter 9 (or 18) to separate scum from the washout solution passing through it at a proper flow rate controlled by the valve. Before and after the cartridge filter 9 (or 18) are pressure gauges 10 (or 19) to indicate an anomalous pressure rise which would occur when the filter element becomes clogged. There is a flow meter 11 (or 20) to indicate the flow rate of the washout solution passing through the main route or the bypass route. The passage of the circulating washout solution is switched by a three-way valve 12 (or 21) and a two-way valve 13 (or 22).

When the development apparatus of the present invention is in operation, the washout solution is circulated in the following manner to catch scum which has occurred in it. The washout solution containing scum enters the circulating pump 8 (or 17) through the outlet 7 (or 16). Then the washout solution branches off into the main route and the bypass route provided with the cartridge filter 9 (or 18). While the washout solution passes through the cartridge filter 9 (or 18) at a proper flow rate controlled by the two-way valve, scum is separated almost completely from it. The main route and the bypass route join together and the washout solution returns to the washout bath 5 (or 14) through the inlet 6 (or 15).

The cartridge filter should preferably be provided with a filter element of wind cartridge structure because of its good performance, handleability, and durability. The circulating pump may be of constant volume type or variable volume type (with an inverter control). The latter is desirable because of its ability to control the volume of circulation according to the number of plates being washed out and the amount of scum that is occurring.

FIG. 3 is a schematic sectional view showing one embodiment of the development apparatus pertaining to the present invention. It is made up of a washout bath 23, a circulating and filtering unit 24, a polymer filtering unit 25, and a washout solution reservoir 26. The washout solution flows in the direction indicated by arrows. When the apparatus is in operation, the exposed photopolymer plate 28 attached to the plate fixing base 27 of rotary type is rubbed with the brush 29 in the washout solution so that the unexposed part is rubbed off and dispersed into the washout solution. The embodiment shown in FIG. 3 further includes a circulating pump 30, a cartridge filter 31, a precipitation tank 32, a filter 33 and a filtrate reservoir 34.

FIG. 4 is a schematic sectional view showing one embodiment of the automatic developing machine which is integrally constructed of a washout bath, circulating unit, and polymer filtering tank. It continuously performs all the steps of washing out, rinsing, water draining, drying, and post exposure. When the machine is in operation, the exposed photopolymer plate attached to the transfer stand 35 is automatically brought into the washout bath 37, in which the photopolymer plate is rubbed with the brush 36 so that the unexposed part is rubbed off and dispersed into the washout solution. In the development step, the washout solution is forced through the cartridge filter 39 by the circulating pump 38 so as to remove the scum that has occurred during development. The washout solution is returned to the washout bath 37 so as to stir the washout solution in the washout bath. During or after the development step, the washout solution is drained from the bottom of the washout bath and is transferred to the precipitation tank 40 which is in the polymer filtering unit 25. In the precipitation tank, the washout solution is allowed to stand so that the polymer particles suspending in the washout solution aggregate and precipitate. The resin precipitates are filtered off by the filter 41 and the filtrate is collected in the filtrate reservoir 42. The filtrate, with or without a fresh washout solution replenished, is recycled to the washout bath, prior to the development step, directly or through the washout solution reservoir (not shown).

The continuous, automatic developing machine shown in FIG. 4 produces a relief by washing out in the washout bath 37 and subsequently passes the relief through the washout solution draining step 43, the water rinsing step 44, the water draining step 45, the drying step 46, and the post exposure step 47, to give a finished printing plate.

The above-mentioned developing machine is provided with the polymer filtering unit in which the washout solution is allowed to stand for aggregation and precipitation of polymer particles suspending therein. Time required for this step is about 30 minutes; however, it is desirable to allow the washout solution to stand for more than 6 hours for complete aggregation and precipitation, maximum filtering efficiency, best operating performance, and adequate exchange cycle of the washout solution. The filter is not specifically limited so long as it can filter off polymer particles. It includes, for example, filter paper, sheet of natural fiber (e.g., cotton) or synthetic fiber, general-purpose cartridge filter, household strainer, and wire net.

As mentioned above, the process of the present invention continuously circulates the washout solution so as to minimize the aggregation and precipitation of scum resulting from the unexposed part which has been rubbed off. This effect is enhanced when the washout solution is incorporated with a surfactant which disperses the polymer particles.

In addition, according to the process of the present invention, the washout solution is drained from the washout bath during or after the development step, and is transferred to the precipitation tank, in which the washout solution is allowed to stand to separate solids by precipitation. (This step utilizes the property that the photopolymer easily aggregates and precipitates.) After filtration, the filtrate is recycled for development.

EXAMPLE

The invention will be described in more detail with reference to the following examples, which are not intended to restrict the scope of the invention. In the apparatus used in the examples, the cartridge filter is provided with a filter element which is TCW-75 or 100PPS made by Advantec Co., Ltd. and the polymer filtering unit is provided with a filter medium which is "Daspon" made by Hakugen Co., Ltd.

EXAMPLE 1 TO 4

Photopolymer plates were formed from the following components dissolved in 40 parts of toluene and 10 parts of water after mixing and defoaming.

- 10 parts of a hydrophilic polymer (mentioned later)
- 45 parts of chlorinated polyethylene (H-135, a product of Osaka Soda Co., Ltd.)
- 15 parts of styrene-butadiene rubber (SBR 1507, a product of Japan Synthetic Rubber Co., Ltd.)
- 28.5 parts of butadiene oligoacrylate (PB-A, a product of Kyoeisha Yushi Co., Ltd.)
- 1 part of benzyldimethylketal (Irgacure 651, a product of Ciba-Geigy Corp.)
- 0.5 part of hydroquinone monomethyl ether For preparation of the hydrophilic polymer, a 1-liter flask equipped with a stirrer was charged with a solution containing the following solutes in 300 parts of tetrahydrofuran. The solution was heated at 65° C. with stirring for 3 hours until reaction was completed.

- 21.8 parts of hexamethylene diisocyanate
- 15.4 parts of dimethylolpropionic acid
- 7.6 parts of polytetramethylene glycol (PG-100, a product of Nippon Polyurethane Kogyo Co., Ltd.)
- 1.0 part of di-n-butyltin dilaurate To the 1-liter flask was added with stirring at room temperature a solution prepared in a separate vessel by dissolving in 100 parts of methyl ethyl ketone 55.3 parts of acrylonitrile-butadiene oligomer containing terminal amino groups (Hycar ATBNBNX 1300×16, a product of Ube Industries, Ltd.). The resulting polymer solution was dried under reduced pressure to remove tetrahydrofuran and methyl ethyl ketone. Thus there was obtained a polymer having a number-average molecular weight of 21,000. This polymer (100 parts) was dissolved in 100 parts of methyl ethyl ketone. To the resulting solution was added with stirring at room temperature a solution containing 4.8 parts of lithium hydroxide dissolved in 100 parts of methyl alcohol. The stirring of the solution was continued for 30 minutes. Thus there was obtained the hydrophilic polymer.

The thus obtained photopolymer plates, which are capable of development with water, were developed after exposure in the following manner using the developing machine as shown in FIGS. 1 and 2. The exposed photopolymer plate was rubbed in 50-70 liters of washout solution which is water containing 4 wt% of surfactant (sodium alkylnaphthalenesulfonate, Pelex NBL, a product of Kao Corp.) so as to rub off the unexposed part. During this development operation, the washout solution was continuously circulated. After repeated development operation, the washout solution dissolved 3-5 kg of polymer from the unexposed part. Owing to the continuous circulation by the circulating pump, the photopolymer plates were not fouled with scum at all. Thus there were obtained defectfree printing plates reproducing the original image with a high fidelity.

COMPARATIVE EXAMPLES 1 AND 2

The same procedure as in Example 1 was repeated except that the circulating pump and cartridge filter were not used. The resulting printing plates were totally unusable because of a large amount of scum sticking to them.

Table 1 summarizes the results obtained in Examples 1 to 4 and Comparative Examples 1 and 2.

that the filtrate was free of aggregates and precipitates. The filtrate (washout solution) was transferred to the developing machine, and the development of photopolymer plates was carried out in the same manner as mentioned above. Development with the filtered washout solution was as fast as development with the fresh washout solution. The washout speed remained unchanged in the subsequent 20 repetitions of the same development procedure. The results are shown in Table 2.

EXAMPLES 7 AND 8

The same procedure as in Examples 5 and 6 was repeated except that the chlorinated polyethylene was replaced by epichlorohydrin rubber (Epichlomer H, a product of Daiso Co., Ltd.). The results are shown in Table 2. The washout speed remained unchanged in the subsequent 20 repetitions of the same development procedure. The washout solution formed no scum at all.

EXAMPLES 9 AND 10

The same procedure as in Examples 5 and 6 was repeated except that the chlorinated polyethylene was replaced by styrene-butadiene-styrene block copolymer (Kraton 1101, a product of Shell Sekiyu Kagaku Co., Ltd.). The results are shown in Table 2. The washout speed remained unchanged in the subsequent 20 repetitions of the same development procedure. The washout solution formed no scum at all.

TABLE 2

| Example No. | Amount of photopolymer dissolved (kg) | Displacement of circulating pump (L/min) | With fresh washout solution | | After 20 recyclings | |
|---|---|---|---|---|---|---|
| | | | Washout speed (mm/15 min) | Amount of scum sticking to plate (g/cm$^2$) | Washout speed (mm/15 min) | Amount of scum sticking to plate (g/cm$^2$) |
| 5 | 5 | 80 | 1.4 | 0 | 1.4 | 0 |
| 6 | 5 | 40 | 1.4 | 0 | 1.4 | 0 |
| 7 | 5 | 80 | 1.4 | 0 | 1.4 | 0 |
| 8 | 5 | 40 | 1.4 | 0 | 1.4 | 0 |
| 9 | 5 | 80 | 1.2 | 0 | 1.2 | 0 |
| 10 | 5 | 40 | 1.2 | 0 | 1.2 | 0 |

TABLE 1

| Example No. (Comparative Example No.) | Amount of photopolymer dissolved (kg) | Capacity of developing machine (L) | Displacement of circulating pump (L/min) | Amount of scum sticking to plate (g/cm$^2$) | Filter used or not used |
|---|---|---|---|---|---|
| 1 | 5 | 70 | 80 | 0 | yes |
| 2 | 5 | 70 | 40 | 0 | yes |
| 3 | 3 | 50 | 50 | 0 | yes |
| 4 | 3 | 50 | 30 | 0 | yes |
| (1) | 5 | 70 | 0 | 2.7 | no |
| (2) | 3 | 50 | 0 | 1.5 | no |

EXAMPLES 5 AND 6

Development of the same photopolymer plates as mentioned above was carried out using the developing machine as shown in FIG. 3, which held 70 liters of the washout solution containing the same surfactant as used in Examples 1 to 4. During the washing out operation, the washout solution was circulated at a flow rate of 80 liters/min or 40 liters/min. After washing out, it was found that the washout solution dissolved about 5 kg of polymer from the unexposed part.

The washout solution was transferred to the polymer filtering unit and was allowed to stand therein for 8 hours to effect the aggregation and precipitation of the polymer particles. After filtration, the filtrate was stored in the washout solution reservoir. It was found

EXAMPLE 11

Development of the same photopolymer plates as mentioned above was carried out using the continuous, automatic developing machine as shown in FIG. 4, which held 70 liters of the washout solution containing the same surfactant as used in Examples 1 to 10. During washing out operation, the washout solution was circulated at a flow rate of 70-80 liters/min. After washing out, it was found that the washout solution dissolved about 5 kg of polymer from the unexposed part in each day of operation.

The used washout solution was filtered and regenerated in the same manner as in Examples 5 and 6. After washing out, the relief underwent the steps of rinsing, water draining, drying, and post exposure. The washout operation was continued for 20 days. The washout speed remained unchanged, and the plates were not fouled with scum at all.

The above-mentioned process and apparatus of the present invention produce the effect of minimizing the aggregation and precipitation of the polymer which has been dispersed in the washout solution during the washout operation and of removing the polymer which has been dispersed in the washout solution. This effect leads to the elimination of defects and fouling due to scum (dispersed polymer) sticking to the plate and apparatus. This effect also leads to the recycling of the washout solution. Therefore, the present invention greatly contributes to cost reduction, improved operation, and good environmental sanitation.

What is claimed is:

1. A process for developing an exposed photopolymer plate having an unexposed non-image portion which is insoluble in aqueous solution, said process comprising:
   (a) removing said unexposed portion of the photopolymer with brushing in a bath of an aqueous washout solution, wherein solid particles of the removed unexposed portion are insoluble in said aqueous washout solution, and forcefully circulating the washout solution at a flow rate higher than 10 cm/s thereby preventing aggregation and precipitation of said particles in said bath;
   (b) draining the washout solution during or after a development operation;
   (c) filtering said solid particles from the drained washout solution to obtain a filtrate; and
   (d) recycling the filtrate as a washout solution.

2. The process according to claim 1, wherein the washout solution is circulated at a flow rate higher than 50 cm/s.

3. The process according to claim 1, wherein the washout solution is circulated at a flow rate higher than 100 cm/s.

4. The process according to claim 1, wherein the washout solution contains a surfactant.

5. The process according to claim 4, wherein the surfactant comprises sodium alkylnaphthalenesulfonate or sodium alkylbenzenesulfonate.

6. The process according to claim 1, further comprising transferring the drained washout solution to a precipitation tank and separating said solid articles from said drained washout solution by precipitation.

* * * * *